US006549056B1

(12) United States Patent
Mannonen

(10) Patent No.: US 6,549,056 B1
(45) Date of Patent: Apr. 15, 2003

(54) METHOD AND APPARATUS FOR PROVIDING A GALVANICALLY ISOLATING CIRCUIT FOR THE TRANSFER OF ANALOG SIGNALS

(75) Inventor: Pentti Mannonen, Vantaa (FI)

(73) Assignee: Electronikkatyo Oy, Helsinki (FI)

( * ) Notice: Subject to any disclaimer, the term of this patent is extended or adjusted under 35 U.S.C. 154(b) by 0 days.

(21) Appl. No.: 09/678,672

(22) Filed: Oct. 4, 2000

(30) Foreign Application Priority Data

Oct. 5, 1999 (FI) .................................................. 992147

(51) Int. Cl.⁷ ................................................ H03L 5/00
(52) U.S. Cl. ........................ 327/333; 327/337; 327/365
(58) Field of Search ................................ 327/333, 337, 327/365, 424, 427, 434

(56) References Cited

U.S. PATENT DOCUMENTS 4,068,135 A * 1/1978 Sonobe et al. ................. 327/91
5,274,343 A * 12/1993 Russell et al. ............... 327/427
5,361,037 A    11/1994 Qui
6,172,630 B1 * 1/2001 Nelson ........................ 341/143

FOREIGN PATENT DOCUMENTS

EP        0 801 468        10/1997

* cited by examiner

Primary Examiner—Kenneth B. Wells
(74) Attorney, Agent, or Firm—Pillsbury Winthrop LLP

(57) ABSTRACT

A galvanically isolating circuit for converting input voltage which is in a first potential to an output variable which is in a second potential. The circuit is characterized by a first input terminal and a second input terminal for receiving the input voltage in the first potential, and a first output terminal and a second output terminal in the second potential for generating the output variable. The circuit is further characterized by a serial capacitance section for providing galvanic isolation between the input terminals and the output terminals, first polarity switching means, which are arranged to operationally connect the input terminals to the serial capacitance section by periodically reversing the polarity, and second polarity switching means, which ate arranged to operationally connect the serial capacitance section to output terminals by periodically reversing the polarity, in synchronism with the first polarity switching means.

7 Claims, 4 Drawing Sheets

METHOD AND APPARATUS FOR PROVIDING A GALVANICALLY ISOLATING CIRCUIT FOR THE TRANSFER OF ANALOG SIGNALS

BACKGROUND OF THE INVENTION

The invention relates to the transfer of an analog signal and particularly to a method and equipment for providing galvanic isolation. The invention further relates to a galvanically isolated electronic switch.

Analog signals need to be transferred from one device into another for example in industrial automation systems. Since the control devices are often in a different potential than the devices to be controlled, or because currents flowing in the neutral conductors of the devices may cause errors, a specific technique is needed for transferring the measurement or control signals of the devices to be controlled: if the difference in potential between the controlling device and the device to be controlled is small, then an ordinary differential amplifier is sufficient. When greater differences in potential are concerned, galvanic isolation is used.

The prior art teaches that galvanic isolation can be carried out for example with a converter, capacitor or opto-isolator. The analog signal to be measured is then first converted into a frequency, pulse ratio, light intensity or a digital form, and after the galvanic isolation the analog signal conforming to the original variable is restored. The present prior art galvanic isolators are, however, expensive.

In U.S. Pat. No. 5,361,037 Isolation Amplifier with Capacitive Coupling, the signals of the device to be controlled are isolated from those of the controlling device by means of a linear isolation amplifier circuit. The circuit in question performs the isolation using Switched Capacitor (SC) switching. The circuit is composed of a voltage-to-charge converter and a differential amplifier functioning as a charge indicator. The disadvantages of the circuit in question are, however, the sensitivity of the switching to stray capacitance, the large capacitors needed in the circuit because of the stray capacitance, and high load caused on the input side.

BRIEF DESCRIPTION OF THE INVENTION

It is an object of the invention to provide a method and an apparatus implementing the method to allow the above mentioned problems to be solved or at least minimized. The object of the invention is achieved with an method and an arrangement characterized by what is stated in the independent claim. The preferred embodiments of the invention are disclosed in the dependent claims.

The circuit of the invention comprises:
- a first input terminal and a second input terminal for receiving input voltage;
- a first output terminal and a second output terminal for generating output current;
- a serial capacitance section for providing galvanic isolation between the input terminals and the output terminals;
- first polarity switching means arranged to operationally connect the input terminals to the serial capacitance section by periodically reversing the polarity; and
- second polarity switching means arranged to operationally connect the serial capacitance section to the output terminals by periodically reversing the polarity, in synchronism with the first polarity switching means.

The switches of a circuit according to a preferred embodiment of the invention may be provided with small capacitors, which provides such advantage as good tolerance for disturbances, low loading of the measurement point and low power consumption at high frequencies. The circuit of the preferred embodiment of the invention loads the input side only a little, and the circuit of the invention is not sensitive to stray capacitance. In addition, a circuit comprising smaller capacitors requires less silicon space and is therefore more economical than a circuit comprising large capacitors. Moreover, the circuit is simple.

According to another preferred embodiment of the invention, the output current which is in the circuit output terminals and which is proportional to the voltage to be measured, is converted to an output voltage in a second capacitance section. This provides the advantage that no power source is needed for the circuit and it is not necessary to examine in connection with installation whether the analog input, for example, should be isolated or not, because the couplings between the inputs, outputs and the controls of the circuit are galvanically isolated from one another.

According to an alternative embodiment of the invention, the second polarity switching means are followed by active means requiring a power source for generating output voltage.

BRIEF DESCRIPTION OF THE DRAWINGS

In the following the invention will be described in greater detail in connection with preferred embodiments and with reference to the accompanying drawings, in which.

DETAILED DESCRIPTION OF THE INVENTION

Figure 1:
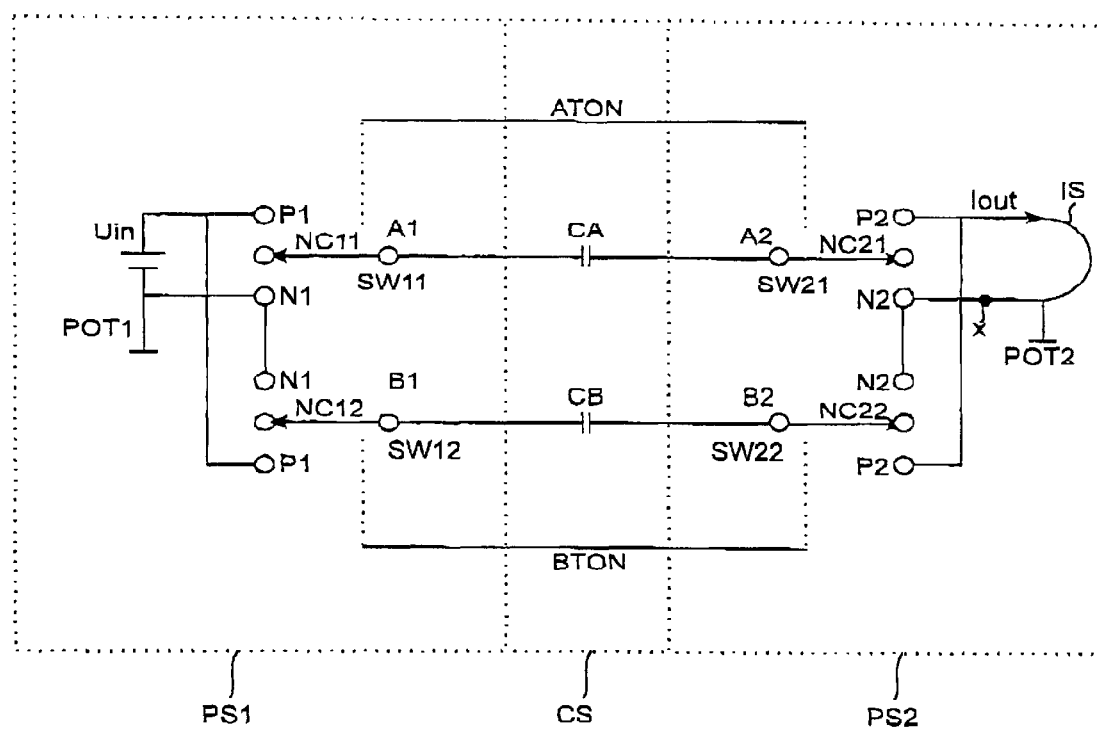
FIG. 1 shows a differential voltage-to-current converter.

FIG. 1 shows a differential voltage-to-current converter. The circuit comprises input terminals P1 and N1, the first polarity switching means PS1, a serial capacitance section CS, i.e. a capacitor, polarity switching means PS2, and output terminals P2 and N2. Output terminals A1 and B1 of the first polarity switching means serve at the same time as input terminals of the capacitance section CS, and output terminals A2 and B2 of the capacitance section CS serve at the same time as input terminals of the second polarity switching means. A voltage to be measured Uin is connected to the circuit's first and second input terminals P1 and N1. The first polarity switching means PS1 is arranged to connect terminal P1 to terminal A1 and teal N1 to terminal B1 and vice versa. Correspondingly, the second polarity switching means PS2 are arranged to connect terminal A2 to terminal P2 and terminal B1 to terminal N2 or vice versa. The first and second polarity switching means are controlled periodically and in synchronism, i.e. they periodically reverse the direction of the current flowing through the capacitance section CS, while maintaining, at the same time, the original direction of the circuit's output current Iout. To avoid transient short circuits, the switched SW1–SW4 must be of the break-before-make type.

The voltage-to-current converter of FIG. 1 directs the voltage to be measured Uin entering the converter through the first polarity switching means PS1 to the capacitance section CS and from there onward through the second polarity switching means PS2 to a current loop IS. In the capacitance section CS the current changes its flow direction, whereas in the current loop portion IS the direction of the current Iout remains unchanged. All the switches SW11, SW21, SW12, SW22 function co-phasally, i.e. they are simultaneously connected first to A terminals, then to NC terminals and finally to B terminals. After this, the switches are again connected to NC terminals and then back to A terminals. The NC terminals in FIG. 1 show how a switch which is to be connected to terminal N, for example, is first detached from terminal P, and vice versa. In other words, the switches are of the break-before-make type.

In the fist step the switches SW11 and SW21 connect capacitor CA between terminals P1 and P2. This charges the capacitor with a charge where Q=CA*Uin. Since the switches SW12 and SW22 connect capacitor CB between terminals N1 and N2, which charges capacitor CB with a charge where Q2=CB*Uin, the circuit is closed. Consequently, the current Iout=f*(CA+CB)*Uin, where f represents the switching frequency of the switches, in the current loop IS current flows from terminal P2 to terminal N2. If capacitors CA and CB are of an equal magnitude (CA=CB=C), the current flowing from terminal P2 to terminal N2 is Iout=*f*C*Uin. This provides for a low penetration of disturbing signals, since the penetration is proportional to the difference between capacitors CA and CB.

In the second step, the switches SW1 1 and SW21 connect capacitor CA between terminals N1 and N2, and the switches SW12 and SW22 connect capacitor CB between terminals P1 and P2. Since the capacitors are of an equal magnitude, the current Iout=2*f*C*Uin in the current loop flows from terminal P2 to terminal N2, i.e. into the same direction and at an equal magnitude as in the first step. In other words, the differential voltage-to-current converter of FIG. 1 converts the measured direct current difference Uin to direct current Iout.

Capacitors CA and CB in FIG. 1 are charged to and discharged by voltage Uin when the switches are in positions P and N, respectively. During a cycle, the charge Q=C*Uin causes two pulse-like direct current outputs Iout=2*f*C*Uin, always to the same direction.

Figure 4:
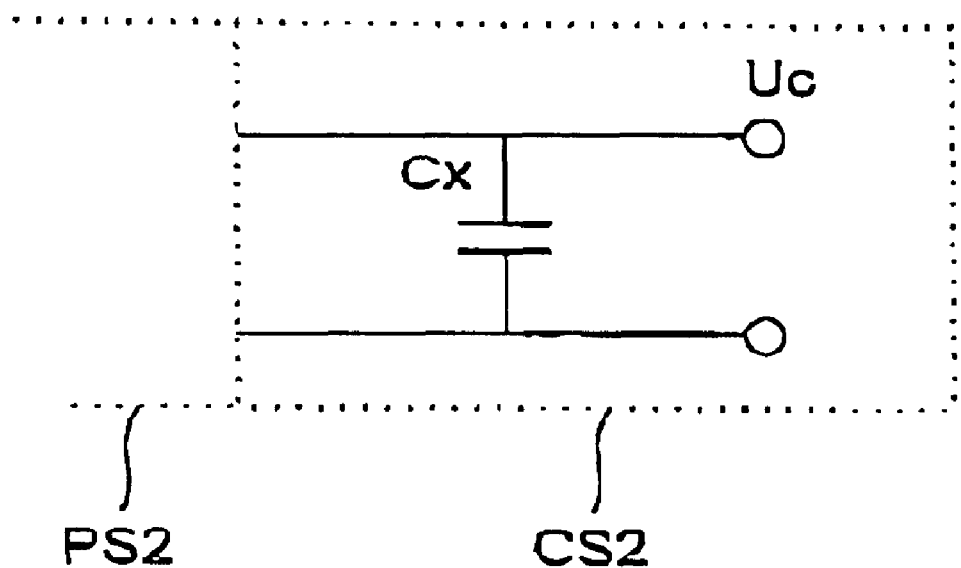
FIG. 4 shows switching according to a preferred embodiment of the invention.

According to a preferred embodiment of the invention, the current loop IS of FIG. 1 can be switched off, and capacitor Cx can be placed to switch off point X, FIG. 4. After several switching cycles, a voltage Uc=k*Uin where coefficient k<1, the coefficient depending on stray capacitors, is generated over capacitor Cx. If the stray capacitors are considerably smaller than capacitors CA and CB, the switching can be used in a galvanically isolated voltage-to-voltage transfer.

The switching shown in FIG. 1 is independent of stray capacitors, because the stray capacitors of input terminals P1 and N1 only load the input, and the voltages over the output stray capacitors are constant and therefore no current is connected to the output.

Figure 2:
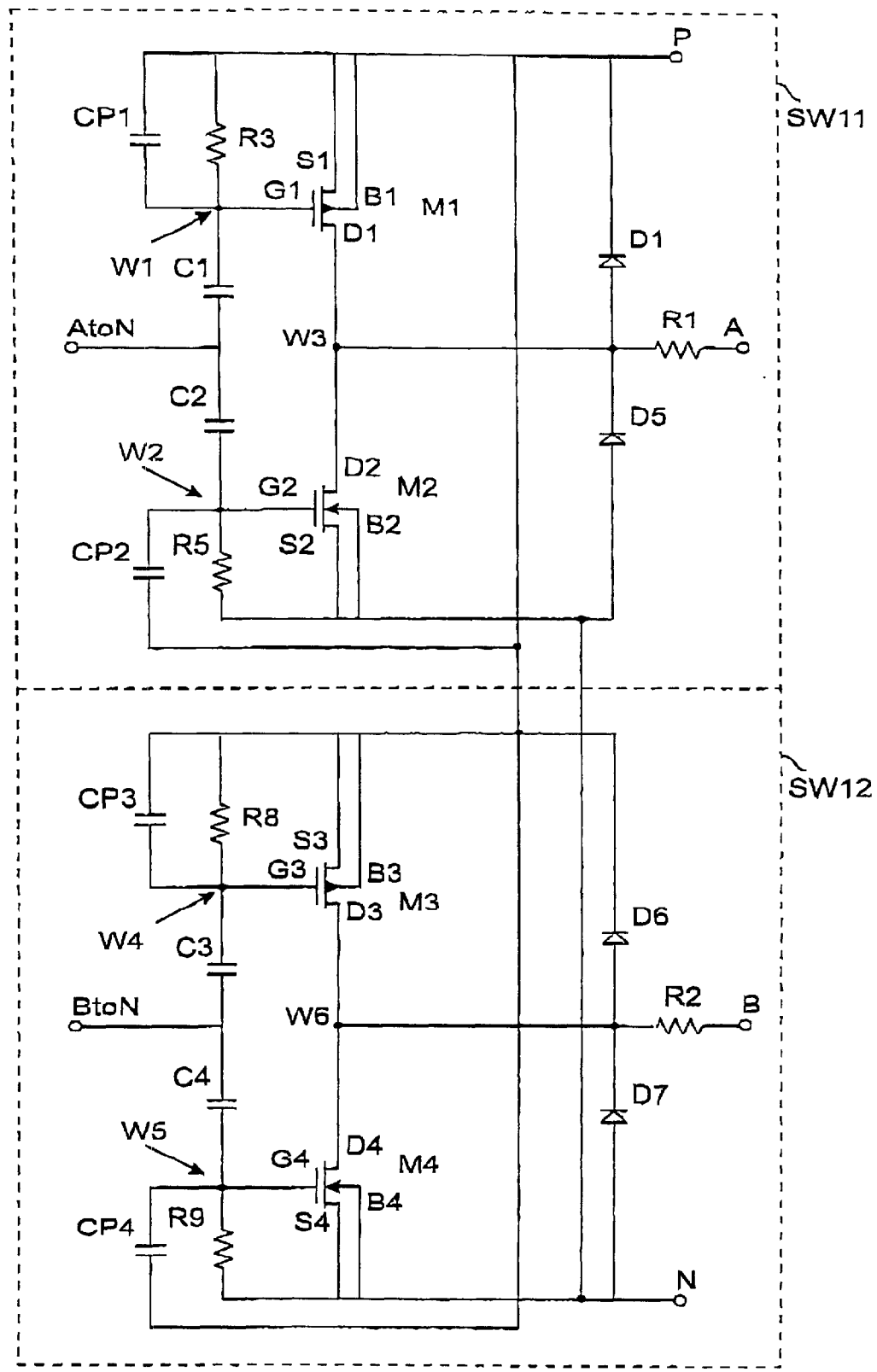
FIG. 2 shows two galvanically isolated analog switches.

FIG. 2 shows two galvanically isolated analog switches of an embodiment of the invention. The measures and values appearing in parentheses after the reference numerals of the components are given by way of example.

The first switch SW11 comprises a PMOS transistor M1 (W=40 μm, L=4 μm) and an NMOS transistor M2 (W=20 μm, L=8 μm). Source S1 and bulk B1 of the PMOS transistor M1 are connected to terminal P of the circuit formed by the two switches SW11 and SW12, gate G1 is connected to terminal W1 of the switch SW11 and drain D1 to terminal W3 of the switch SW11. Source S2 and bulk B2 of the NMOS transistor M2 are connected to terminal N of the circuit formed by the two switches SW11 and SW12, gate G2 is connected to terminal W2 of the switch SW11, and drain D2 to terminal W3 mentioned above. Between terminals W1 and P are connected, in parallel, capacitor CP1 (0.25 pF) and gate-to-source resistor R3 (1 Mohm). Between terminal W2 and terminal P is connected capacitor CP2 (0.25 pF). Between terminal W2 and terminal N is connected gate-to-source resistor R5 (1 Mohm). Between input terminal AToN and terminal W1 is connected capacitor C1 (0.25 pF) and between input terminal AToN and terminal W2 is connected capacitor C2 (0.25 pF).

The second switch SW12 shown in FIG. 2 comprises a PMOS transistor M3 (W=40 μm, L=4 μm) and an NMOS transistor M4 (W=20 μm, L=8 μm). Source S3 and bulk 3 of the PMOS transistor M3 are connected to terminal P mentioned above, gate G3 is connected to terminal W4 of the switch SW12 and drain D3 to terminal W6 of the switch SW12. Source S4 and bulk B4 of the NMOS transistor M4 are connected to the above mentioned terminal N, gate G4 is connected to terminal W5 of the switch SW12 and drain D4 to terminal W6 of the switch SW12. Between terminals W4 and P are connected, in parallel, capacitor CP3 (0.25 pF) and gate-to-source resistor R6 (1 Mohm). Between terminal W5 and terminal P is connected capacitor CP4 (0.25 pF). Between terminal W5 and terminal N is connected gate-to-source resistor R9 (1 Mohm). Between output terminal BToN and terminal W4 is connected capacitor C3 (0.25 pF). Between output terminal BToN and terminal W5 is connected capacitor C4 (0.25 pF).

Control inputs AtoN and BtoN shown in FIG. 2 can be galvanically isolated from the rest of the circuit by using capacitors C1, C2, C3 and C4 which may be formed quite simply, for example, of the contact's first netal layer, and isolating layer (such as silicon dioxide) and the second metal layer underneath. Because of the resistors R3, R5, RS and R9, the average values of the gate-to source voltages of the transistors M1–M4 are about 0 volts. Consequently, in a polarity switch situation the conduction transistor (e.g. M1) stops conducting until the other transistor (M2) belonging to tie same switch (SW11) is connected.

Capacitors CP1, CP2, CP3 and CP4 in FIG. 2 reduce the nonlinearity of the gate-to-source capacitors. Capacitors CP1, CP2, CP3 and CP4 are formed of the second metal layer, the isolation underneath it and a silicon base connected to a contact. FIG. 2 further shows electrostatic shields, i.e. resistor R1 (<1 kohm), diode D1 and diode D5, and resistor R2 (<1 kohm), diode D6 and diode D7, connected to output contacts A and B, respectively. When the circuit of FIG. 2 is to be implemented as a microcircuit, capacitors CP1, CP2, CP3 and CP4 are automatically formed of parasitic components included in the connection.

The galvanically isolated analog switch of FIG. 2 operates as follows. A square wave voltage (where U=15V, F=500 kHz, for example) which is differential (with regard to the P and N terminals, for example) is connected between terminals AtoN and BtoN to control the operation of the transistors. Control voltages and AtoN and BtoN of the switches SW11 and SW12 are connected through a thick capacitive isolator (C1, C2, C3 and C4), such as silicon dioxide which is able to withstand over 400 volts even in normal processes. When the voltage V (AtoN-BtoN) between terminals AtoN and BtoN becomes positive, transistors M2 and M3 become conductive. Output terminal A is then connected to terminal N and output terminal B to terminal P.

The time transistors N and M3 stay in the conductive state depends on the time constant of the gate (e.g. (C1+CP1+Cg1)*R3 where Cg1 represents the gate-to-source capacitance of transistor M1), on control voltage V(AtoN-BtoN) to be connected between terminals AtoN and BtoN, and on the threshold voltage of the transistors. When voltage V(AtoN-BtoN) becomes negative, transistors M1 and M4 become conductive. Terminal A then connects to terminal P and terminal B to terminal N.

Terminals P and N, i.e. measurement input, in FIG. 2 are correspondingly set as operating voltage and ground terminals for the microcircuit. According to the invention, these terminals are not used for power input, as in prior art microcircuits. The transistors and other parts of the microcircuit can thus be made small, which allows for small power losses and low input loads.

The microcircuit of FIG. 2 can be implemented using CMOS processes. If a plural number of switches of the invention are to be integrated into one and the same silicon chip, SOI technique (Silicon-On-Insulator), for example, can be used. Instead of controls AtoN and BtoN, optical switching can also be used, a hither voltage endurance being thereby obtained.

In FIG. 2 the switches are implemented using MOS transistors. Another alternative to implement the switches of FIG. 2 is to use bipolar technique. In that case, a saw-tooth voltage is connected between terminals AtoN and BtoN to control the bipolar transistors.

Figure 3:
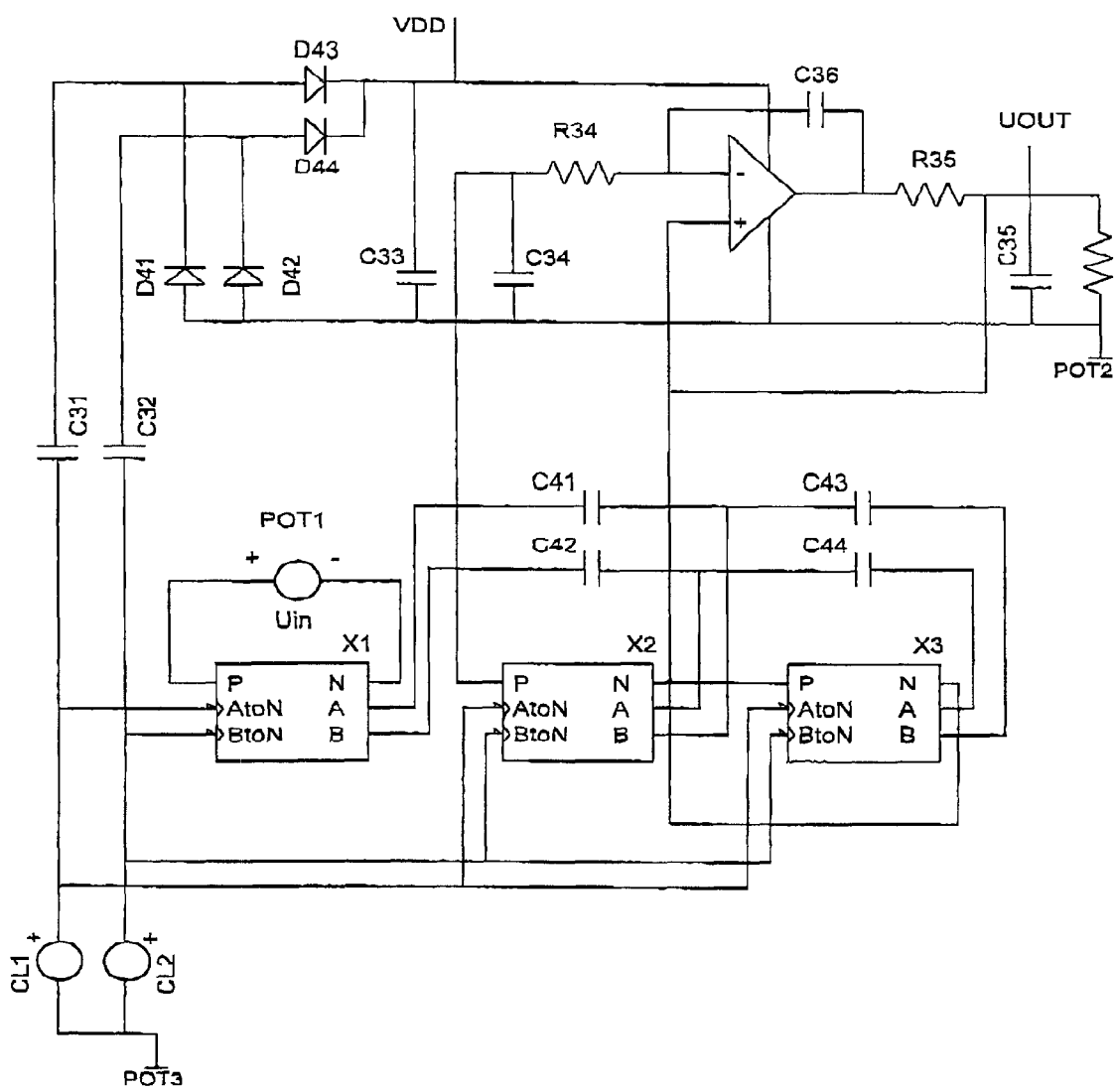
FIG. 3 shows an embodiment of the invention for generating output voltage proportional to the voltage to be measured.

The output voltage of terminals A and B in FIG. 2 is a differential square wave voltage, the peak-to-peak value of the voltage being the voltage between terminals P and N. If external capacitors are used for connecting terminals A and B to a third potential, the output generated is a differential alternating current I=fC*V(P−N) where f represents the switching frequency of the switches, C represents the value of the external capacitor and V(P−N) the voltage between terminals P and N. This alternating current can be rectified using another microcircuit of FIG. 2, for example. FIG. 3 illustrates this alternative embodiment of the invention, where the voltage Uin in the first potential between terminals P1 and N1 is converted to output voltage Uout of the second potential.

In FIG. 3, the voltage to be measured Uin is supplied to terminals P ad N of a first microcircuit X1. The control signal for terminals AtoN and BtoN of microcircuits X1, X2 and X3 is obtained from clocks CL1 and CL2, the second terminal of which are connected to circuit potential 3. VDD represents the operating voltage of the circuit.

The output currents of terminals A and B of microcircuits X1, X2 and X3 are converted to voltage in sC resistors C41, C42, C43 and C44. The conductance (g) values of the resistors are defined as the product of the switching frequency (f) of the switches and the values of the capacitors concerned (g=C*f). There is no direct current flowing through the resistors.

The function of resistors R34 and R35 and capacitors C34 and C36 is to stabilize the operation of microcircuit X4.

The output voltage of the circuit can be supplied to a load depicted in FIG. 3 by capacitor C35 and resistor R36.

In FIG. 3, power is supplied to microcircuit X4 through capacitors C31 and C32. Diodes D41–D43 rectify the currents flowing through capacitors C31 and C32. C33 acts as a filter capacitor for the operating voltage.

The voltage amplification in FIG. 3 is Uout Uin=(C41+C42)/(C43+C44). If the amplification is defined as one, the input voltage to be measured Uin is obtained directly as the value of output voltage Uout.

It is apparent to a person skilled in the art that as technology advances, the basic idea of the invention can be implemented in various ways. The invention and its embodiments are therefore not restricted to the above described examples but they may vary within the scope of the claims.

What is claimed is:

1. A galvanically isolating circuit for converting an input voltage to an output variable, the output variable being either and output voltage or an output current, the circuit comprising:
   a first input terminal and a second input terminal for receiving the input voltage;
   a first output terminal and a second output terminal for producing the output variable; and
   a serial capacitance section for providing galvanic isolation from the input terminals to the output terminals, that galvanically isolating circuit further comprising:
      a first polarity switching means arranged to operationally connect the input terminals to the serial capacitance section by periodically reversing the polarity of the input terminals;
      a second polarity switching means arranged to operationally connect the serial capacitance section to the output terminals by periodically reversing the polarity of the output terminals, in synchronism with the first polarity switching means, the first polarity switching means comprising:
         a control input for receiving a control signal comprising a first half cycle and a second half cycle;
         a first transistor for connecting the first input terminal to a first capacitor of the serial capacitance section during said second half cycle; and
         a second transistor for connecting the second input terminal to the first capacitor of the serial capacitance section during said second half cycle, wherein the control input is operationally connected to control contacts of the transistors through a galvanically isolating connection.

2. The galvanically isolating circuit of claim 1, wherein the galvanically isolating connection is a capacitive connection which is integrated into the same chip with the transistors and for isolating the control input from the transistors, the connection is made of the first metal layer of the contact, and isolating layer and the second metal layer underneath the isolating layer.

3. The galvanically isolating circuit of claim 2, wherein the galvanically isolating connection is an optical connection.

4. The galvanically isolating circuit of claim 1, wherein the first and/or the second transistor is a MOS transistor.

5. The galvanically isolating circuit of claim 1, wherein the fir and/or the second transistor is a bipolar transistor.

6. The galvanically isolating circuit of claim 1, wherein for generating an output voltage from an output current, the second polarity switching means are followed by a second capacitance section.

7. The galvanically isolating circuit of claim 1, wherein for generating output voltage, the second polarity switching means are followed by active means.

* * * * *